United States Patent [19]

Martin et al.

[11] Patent Number: 5,967,801

[45] Date of Patent: Oct. 19, 1999

[54] MODULAR PLUG HAVING COMPENSATING INSERT

[75] Inventors: Ralph Sykes Martin, Mount Airy; Todd Jason Kuvshinikov, Winston-Salem, both of N.C.

[73] Assignee: The Whitaker Corporation, Wilmington, Del.

[21] Appl. No.: 08/979,805

[22] Filed: Nov. 26, 1997

[51] Int. Cl.[6] .......... H01R 9/09

[52] U.S. Cl. .......... 439/76.1; 439/404; 439/941

[58] Field of Search .......... 439/76.1, 620, 439/418, 404, 941

[56] References Cited

U.S. PATENT DOCUMENTS

| | | | |
|---|---|---|---|
| 5,399,106 | 3/1995 | Ferry | 439/620 |
| 5,414,393 | 5/1995 | Rose et al. | 333/1 |
| 5,431,584 | 7/1995 | Ferry | 439/620 |
| 5,435,752 | 7/1995 | Siemon et al. | 439/620 |
| 5,571,035 | 11/1996 | Ferrill | 439/894 |
| 5,766,027 | 6/1998 | Fogg | 439/76.1 |

*Primary Examiner*—Gary F. Paumen
*Attorney, Agent, or Firm*—Robert J. Kapalka

[57] ABSTRACT

A modular plug electrical connector for terminating a plurality of communications wires which are associated as signal pairs in a communications system includes a dielectric housing having a cavity and a compensating insert which is mountable in the cavity. The compensating insert includes a dielectric substrate which carries conductive traces, and the traces are arranged to be connected to selected ones of the wires. The traces are routed on the substrate to provide capacitive coupling between selected signal pairs so as to compensate for crosstalk between the signal pairs, thereby reducing crosstalk in the connector.

6 Claims, 5 Drawing Sheets

MODULAR PLUG HAVING COMPENSATING INSERT

FIELD OF THE INVENTION

The invention relates to a modular plug electrical connector having a device which reduces crosstalk between signal lines in a communications system.

BACKGROUND OF THE INVENTION

Due to increases in data transmission rates in telecommunications systems, crosstalk has become a significant problem. Crosstalk may be defined as stray energy which is coupled from one signal line onto an adjacent signal line by either capacitive or inductive coupling. This crosstalk results in signal noise which interferes with the purity of the signal being transmitted.

A commonly used telecommunications wiring system is unshielded twisted pair wiring wherein pairs of wires are twisted about each other. The wires in a twisted pair carry related signals and are thus known as signal pairs. Each of the wires in a signal pair carries an equal but opposite signal; that is, the wires carry signals of the same magnitude which are respectively positive and negative. Since these signals are equal but opposite, they generate fields that are equal but opposite. In a twisted pair these equal and opposite fields cancel each other. Thus, little or no crosstalk can occur between one twisted pair and an adjacent twisted pair.

Crosstalk in unshielded twisted pair wiring systems primarily arises in the electrical connectors which provide an interface between successive runs of cable in a system. Industry standard electrical connectors for telecommunications systems include modular plugs and jacks. These connectors have terminals which are spaced closely together and parallel to each other, and this close and parallel arrangement is conducive to crosstalk between adjacent lines in different ones of the signal pairs. Further, the terminals in a modular plug are dedicated to specific ones of the twisted wires according to a known industry standard such as EIA/TIA-568. Therefore, ends of the wires must be arranged in a closely spaced parallel sequence in the plug, and these parallel ends are also conducive to crosstalk.

Prior art techniques for reducing crosstalk have focused primarily on modular jacks and on the circuit boards on which the modular jacks are mounted. Since crosstalk increases logarithmically as the frequency of the signal increases, the constant trend toward higher data transmission rates has resulted in a need for further crosstalk reduction which may be obtained by reducing crosstalk in the modular plug.

U.S. Pat. No. 5,571,035 discloses a modular plug electrical connector having a wire organizer, or load bar, which maintains the wires in an organized array in the connector in order to reduce crosstalk in the connector. The load bar has upper and lower surfaces with grooves, and each of the grooves receives both wires of a respective signal pair. This device increases the separation between wires of different signal pairs, thereby avoiding crosstalk which would otherwise occur between the wires of different signal pairs. Still, some crosstalk occurs between terminals in the modular plug. Also, crosstalk which occurs in the modular jack of a communications cable rises significantly at very high frequencies on the order of 200–300 MHz. There is a need for reducing crosstalk in a modular plug and for improving overall crosstalk performance in a communications system.

SUMMARY OF THE INVENTION

The invention is a modular plug electrical connector for terminating a plurality of communications wires which are associated as signal pairs in a communications system. The electrical connector comprises a dielectric housing having a cavity and a compensating insert which is mountable in the cavity. The compensating insert includes a dielectric substrate which carries conductive traces. The conductive traces are arranged to provide capacitive coupling between selected signal pairs so as to compensate for crosstalk between the signal pairs, thereby reducing crosstalk in the connector.

In one embodiment each of the conductive traces has one end arranged to be connected to a selected one of the wires, and an opposite end which is routed on the substrate to provide a close spatial relationship with a selected different one of the wires.

In an alternate embodiment each of the conductive traces has one end which is arranged to be connected to one of the wires, and an opposite end which is arranged to be connected to a terminal in the modular plug. The traces are routed on the board to provide capacitive coupling between selected ones of the traces so as to compensate for crosstalk between the signal pairs.

BRIEF DESCRIPTION OF THE DRAWINGS

The invention will now be described by way of example with reference to the accompanying drawings wherein.

and

Figure 5:
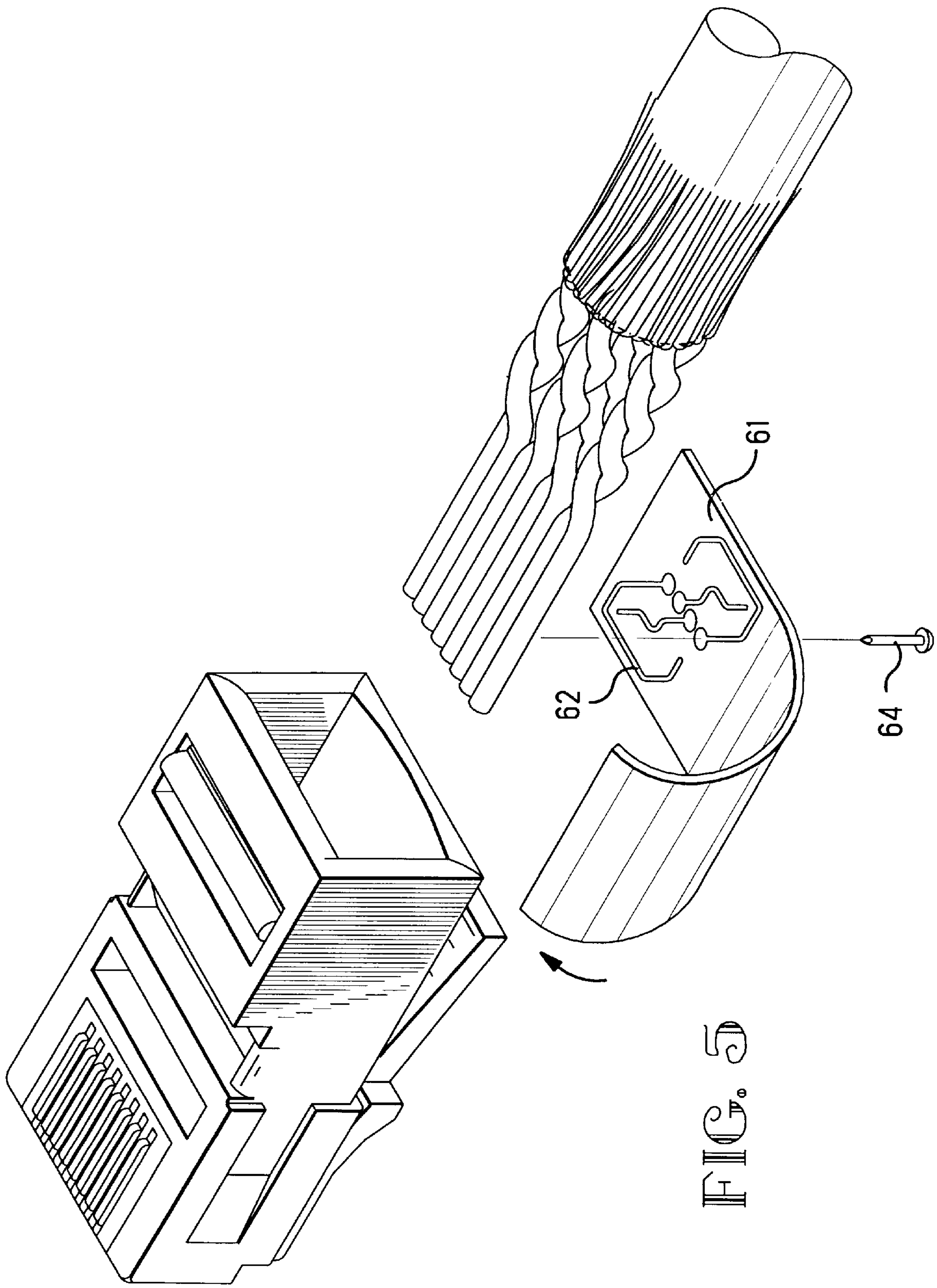

FIG. 5 is an isometric view of yet another embodiment of the modular plug and compensating insert.

DETAILED DESCRIPTION OF A PREFERRED EMBODIMENT

Figure 1:
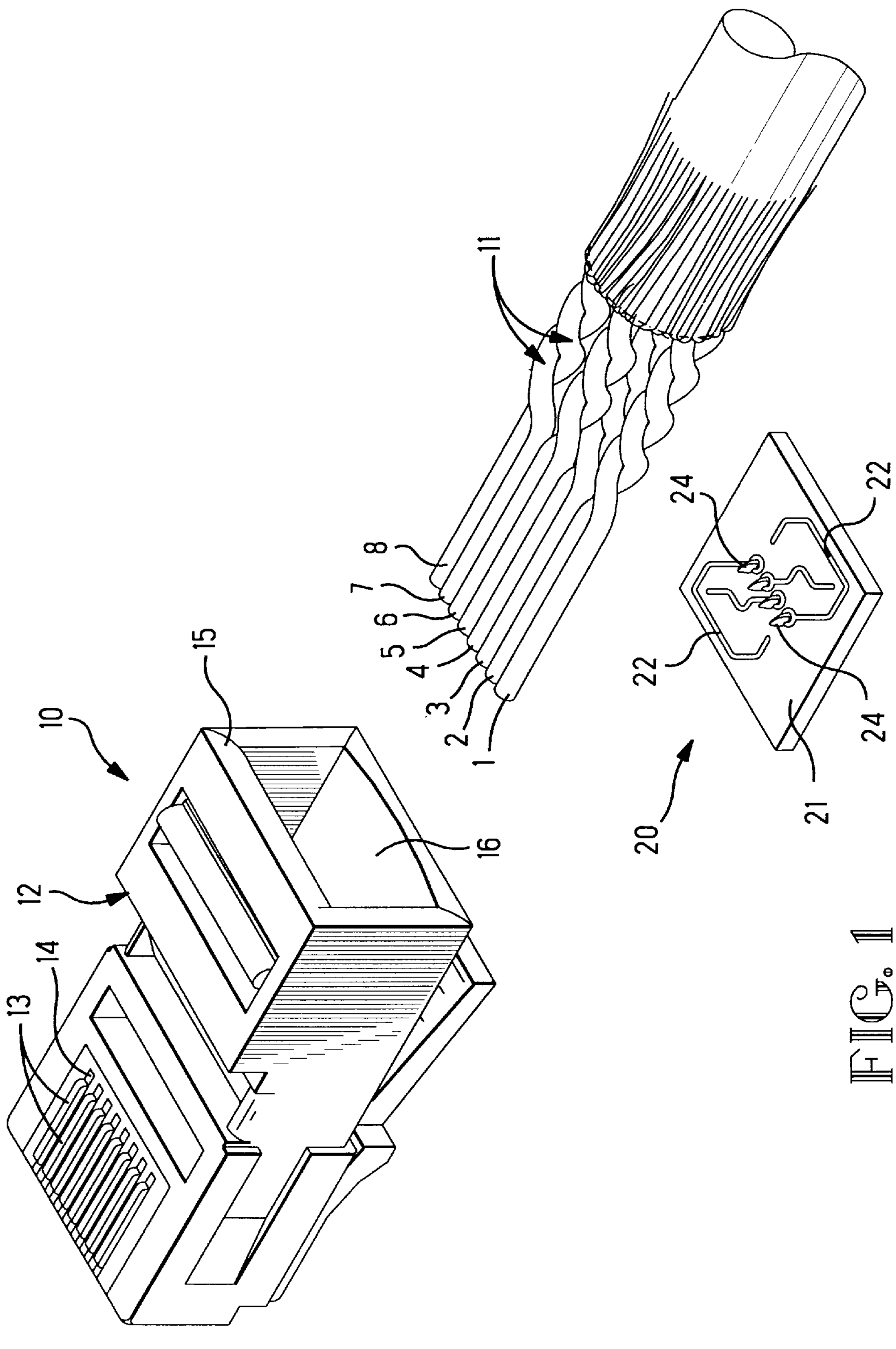
FIG. 1 is an isometric view of a modular plug electrical connector having a compensating insert according to the invention.
Figure 2:
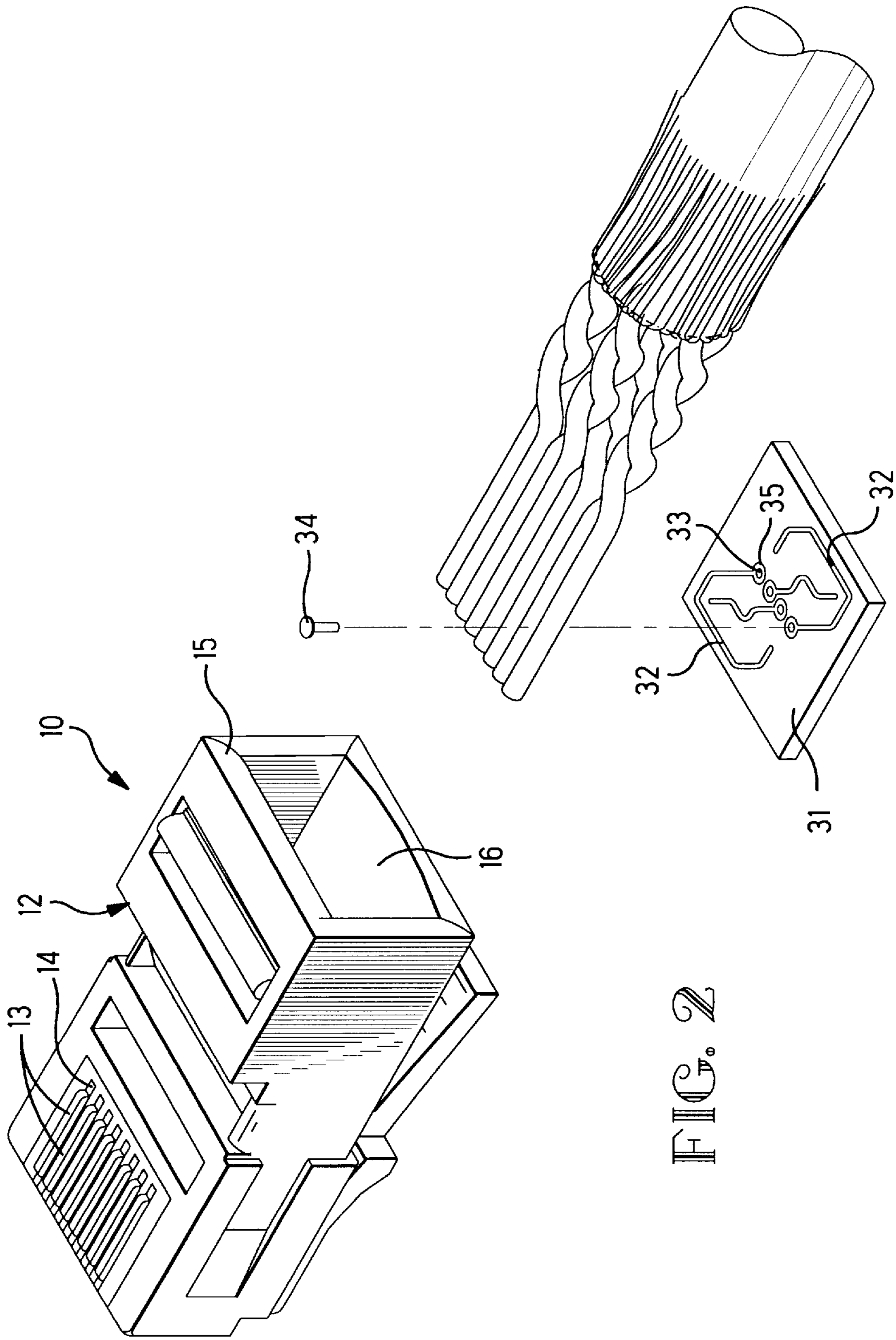
FIG. 2 is an isometric view of the modular plug having a different embodiment of the compensating insert.

There is shown in FIG. 1 an electrical connector 10 of a type which is commonly referred to as a modular plug that is matable with a modular jack (not shown) for interconnecting a plurality of conductive wires 11 in a communications system. The connector 10 as described herein is an eight position modular plug for use with an eight wire communications cable. However, it should be understood that the invention can also be applied to other connectors which are terminable to different numbers of wires.

The wires 11 comprise pairs of wires which are twisted together during manufacture, and each twisted pair of wires is associated as a signal pair. Ends of the wires 11 are untwisted and arranged side-by-side prior to termination in the connector 10. The side-by-side wires may be bonded together to form a unitary ribbon cable as disclosed in U.S. Pat. No. 5,592,739. The side-by-side wires are assigned consecutive numbers 1-8 for individual reference. According to an industry standard, wires 1-2 comprise a signal pair and wires 7-8 comprise a signal pair. Further, wires 4-5 comprise a signal pair, and wires 3-6, which flank the wires 4-5, also comprise a signal pair. Due to the proximity of adjacent wires in this arrangement, some crosstalk will occur between adjacent wires 3 and 4 which are in different signal pairs, and some crosstalk will occur between adjacent wires 5 and 6 which are also in different signal pairs. According to the invention, compensating crosstalk is introduced in the wires in order to cancel the crosstalk which otherwise occurs.

The electrical connector 10 comprises a dielectric housing 12 which holds a plurality of terminals 13, eight in the present example, that are arranged side-by-side in respective slots 14. Each of the terminals 13 is dedicated to a respective one of the wires 1-8 in the communications cable. The housing 12 has a wire-receiving end 15 and a cavity 16 which extends into the housing from the wire-receiving end. The cavity is open to the slots 14 at a termination end of the housing. Prior to termination of the wires in the connector, the terminals 13 are in raised positions in their respective slots 14 so that the wires 1-8 may be inserted into the cavity 16 and into respective positions in alignment with the terminals 13. Each of the wires 1-8 comprises a conductive core which is surrounded by an insulative jacket. The terminals 13 are driven into the wires 1-8 by an appropriate tool so that the terminals pierce the insulative jacket and make electrical connection with the conductive core.

The connector 10 further comprises a compensating insert 20 which is mountable within the cavity by insertion of the compensating insert into the wire-receiving end of the housing. The compensating insert comprises a dielectric substrate, such as a circuit board 21, which carries electrically conductive traces 22. Each of the traces is arranged to be electrically connected with a selected one of the wires 1-8, and each of the traces extends laterally to a respective position on the substrate which is in close spatial relationship with a selected other one of the wires to provide a capacitive coupling therewith. For example, a trace which is electrically connected to wire 3 may extend laterally to a position on the substrate which is below wire 5, thereby adding capacitance between wires 3 and 5 which compensates for crosstalk between wires 3 and 4. Also, a trace which is electrically connected to wire 4 may extend laterally to a position on the substrate which is below wire 6, thereby adding capacitance between wires 4 and 6 which compensates for crosstalk between wires 5 and 6. a pair of opposed beams which are configured to slice the insulation of a wire and engage the conductive core of the wire therebetween. A stuffer cap 45 may be used to drive the wires into position between the beams. The contact pads 47 are engageable with terminals 48 in connector housing 40. The terminals 48 are exposed at a mating face of the housing for engagement with terminals of a mating modular jack (not shown). Each of the terminals 48 has a laterally open U-shaped engaging section 49 that receives the leading end of the circuit board and engages one of the contact pads 47 on the board. The circuit board has notches 43 which receive latch members in the connector housing to secure the circuit board in the housing.

The traces 42 are arranged on the board 41 in a spatial relationship that provides capacitive coupling between signal pairs so as to compensate for crosstalk between the signal pairs, thereby reducing crosstalk in the connector. A number of schemes which provide crosstalk compensation by routing of traces on a board are known, and all such schemes are considered to be within the scope of the invention. One such scheme is disclosed in U.S. Pat. No. 5,414,393, which disclosure is incorporated by reference as if set forth fully herein.

Figure 3:
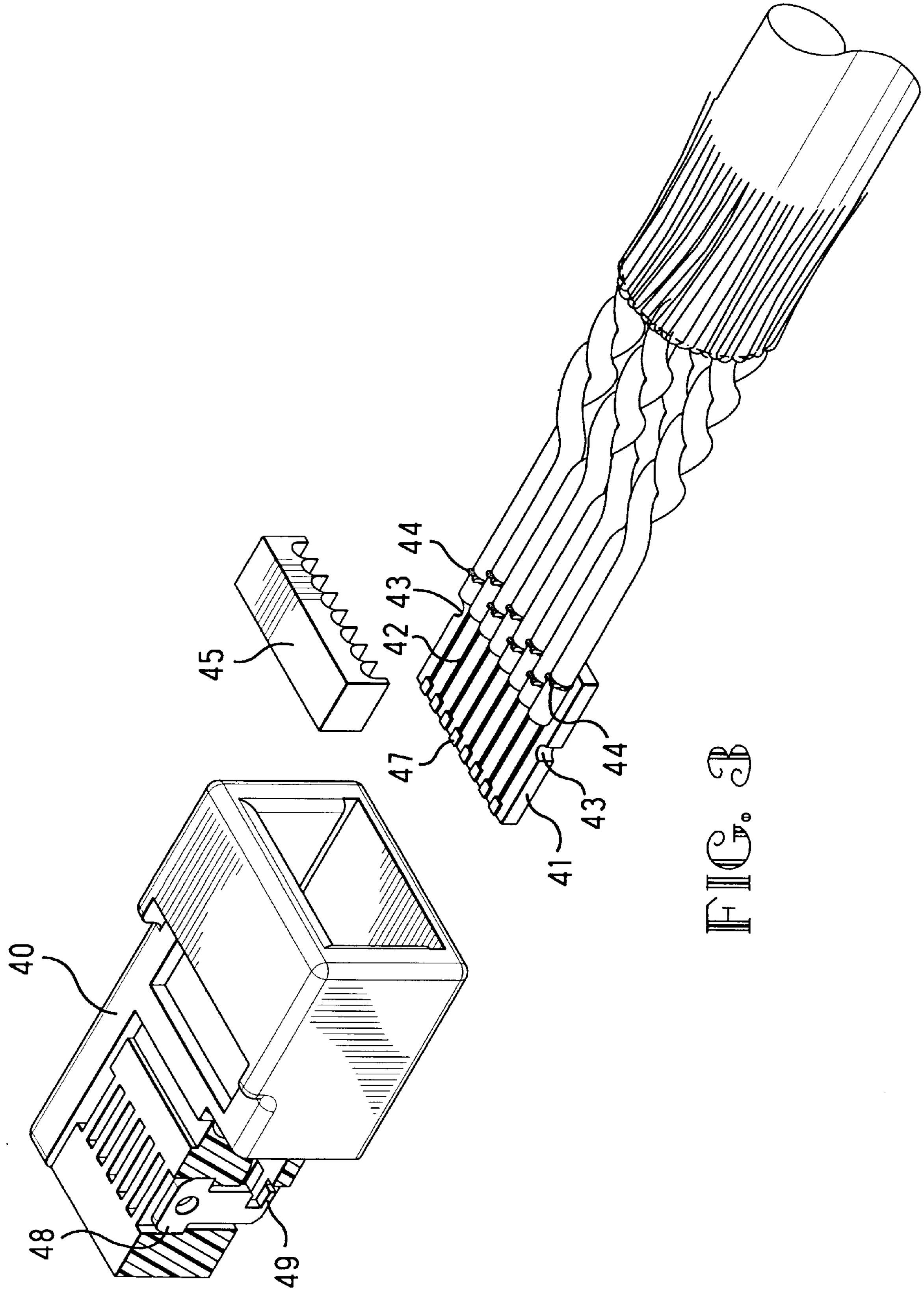
FIG. 3 is an isometric view of an alternate embodiment of a modular plug having a compensating insert.
Figure 4:
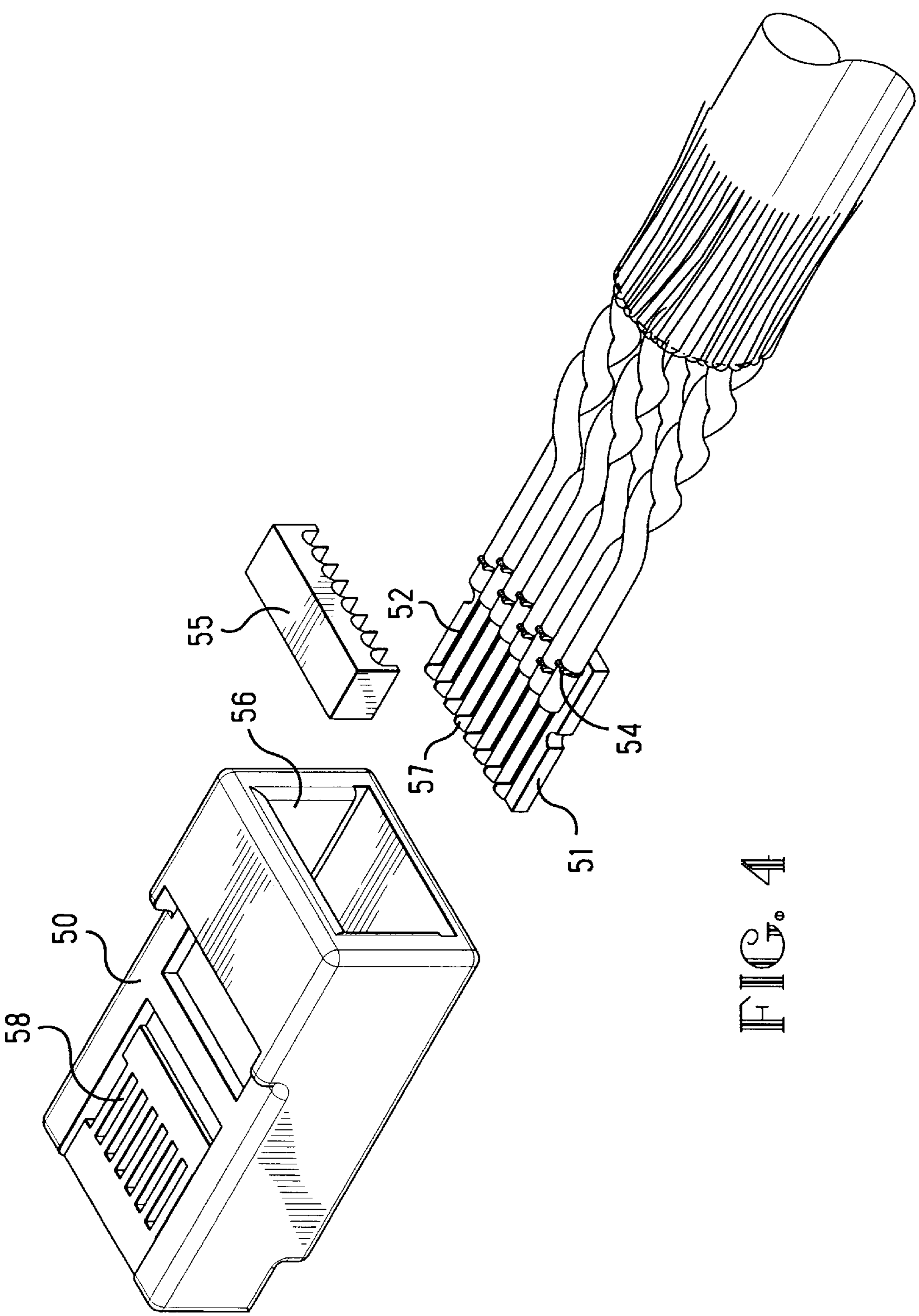
FIG. 4 is an isometric view of still another embodiment of the modular plug and compensating insert.

Another embodiment of the invention is shown in FIG. 4. Similar to the embodiment of FIG. 3, a circuit board 51 carries conductive traces 52 having wire ends that are connected to insulation displacement contacts 54 which can receive a stuffer cap 55. Additionally, terminal ends of the traces are connected to a plurality of parallel planar contacts 57 at a leading edge of the board. Again, the traces 52 are arranged on the board to provide crosstalk compensation in the connector. Cavity 56 in the connector housing 50 is open to the front mating face of the housing, and the contacts 57 become exposed at the mating face through slots 58 for engaging contacts of a modular jack when the circuit board 51 is installed in the housing.

Another embodiment of the invention is shown in FIG. 5. The compensating insert comprises a flexible dielectric substrate 61 such as a flexible film which carries conductive traces 62 and may include an adhesive on its surface. The flexible substrate may be wrapped around the array of wires and held to the wires by the adhesive. Contact pins 64 are inserted through the flexible substrate to engage the conductive traces and pierce the wires.

The invention provides a modular plug electrical connector with a compensating insert which reduces crosstalk in the connector. The compensating insert has conductive traces which can be arranged to enable controlled amounts of compensating crosstalk between signal pairs in order to cancel unavoidable crosstalk which occurs in a communications system. Enabling controlled amounts of compensating crosstalk permits the system to be tuned for optimum performance and results in a reduced net crosstalk for the system.

The invention having been disclosed, a number of variations will now become apparent to those skilled in the art. Whereas the invention is intended to encompass the foregoing preferred embodiments as well as a reasonable range of equivalents, reference should be made to the appended claims rather than the foregoing discussion of examples, in order to assess the scope of the invention in which exclusive rights are claimed.

We claim:

1. A modular plug electrical connector for terminating a plurality of communications wires which are arranged in a side-by-side parallel array and are associated as signal pairs, the electrical connector comprising:

a dielectric housing which holds terminals that are engageable with mating terminals of a modular jack, the housing having a cavity which opens through a wire-receiving end of the housing and extends to the terminals, and a compensating insert which is mountable in the cavity, the compensating inserting including a dielectric substrate which carries conductive traces, each of the traces having a wire end that is arranged for electrically connecting with a respective one of the wires, and a terminal end that is arranged for electrically connecting with a respective one of the terminals in the housing, the traces being arranged on the substrate to provide capacitive coupling between selected ones of the signal pairs such that crosstalk in the electrical connector is reduced.

2. The electrical connector of claim 1, further comprising contact pins which are engageable with the wires for electrically connecting the wires to the conductive traces.

3. The electrical connector of claim 2 wherein each of the contact pins includes a pair of spaced-apart beams which are configured for insulation displacement termination of a respective one of the wires.

4. The electrical connector of claim 3 wherein the contact pins are fixedly attached to the substrate.

5. The electrical connector of claim 1 wherein the terminal ends of the traces define contact pads that are arrayed along an edge of the substrate.

6. The electrical connector of claim 1 wherein the substrate carries a plurality of parallel planar contacts that are joined to the terminal ends of the traces.

* * * * *